US006759893B2

(12) United States Patent
Gailhard et al.

(10) Patent No.: US 6,759,893 B2
(45) Date of Patent: Jul. 6, 2004

(54) TEMPERATURE-COMPENSATED CURRENT SOURCE

(75) Inventors: Bruno Gailhard, Trets (FR); Olivier Ferrand, Puyloubier (FR)

(73) Assignee: STMicroelectronics SA, Montrouge (FI)

( * ) Notice: Subject to any disclaimer, the term of this patent is extended or adjusted under 35 U.S.C. 154(b) by 0 days.

(21) Appl. No.: 10/303,650

(22) Filed: Nov. 25, 2002

(65) Prior Publication Data

US 2003/0132796 A1 Jul. 17, 2003

(30) Foreign Application Priority Data

Nov. 26, 2001 (FR) .......................................... 01 15259

(51) Int. Cl.[7] ............................................ H01L 35/00

(52) U.S. Cl. ...................... 327/513; 327/512; 327/542; 327/543

(58) Field of Search ................................ 327/512, 513, 327/538, 539, 540, 541, 542, 543; 323/312, 313, 315

(56) References Cited

U.S. PATENT DOCUMENTS 5,038,053 A * 8/1991 Djenguerian et al. ....... 327/513
6,087,820 A * 7/2000 Houghton et al. .......... 323/315
6,528,979 B2 * 3/2003 Kimura ...................... 323/313

OTHER PUBLICATIONS

Neuteboom et al., "A DSP–Based Hearing Instrument IC", IEEE Journal of Solid–State Circuits, vol. 32, No. 11, Nov. 1997 pp. 1790–1806.*

* cited by examiner

*Primary Examiner*—Long Nguyen
(74) *Attorney, Agent, or Firm*—Lisa K. Jorgenson; Allen, Dyer, Doppelt, Milbrath & Gilchrist, P.A.

(57) ABSTRACT

A temperature-compensated current source includes a first arm fixing a reference voltage, a second arm fixing a reference current, and a third arm providing an output current obtained by copying the reference current in a first current mirror. A second current mirror copies, in the voltage reference arm, the reference current while a voltage copying circuit copies the reference voltage at a node of the second arm connected to ground by a first resistor series-connected with n parallel-connected diodes. A second resistor is parallel-connected with the assembly formed by the first resistor series-connected with the n parallel-connected diodes.

34 Claims, 2 Drawing Sheets

TEMPERATURE-COMPENSATED CURRENT SOURCE

FIELD OF THE INVENTION

The present invention relates to temperature-compensated current sources, and more particularly, to the optimization of a current reference circuit providing temperature compensation for the generated current.

BACKGROUND OF THE INVENTION

The possibility of obtaining transistors with practically identical characteristics has given rise to a new generation of current sources known as current mirrors. A rise in the temperature leads especially to the following results: an increase in the leakage currents of the transistors used in such current reference circuits, an increase in the stored charge, and an increase in gain, etc.

These phenomena, among others, involve a modification of the intrinsic characteristics of the transistors implemented in the current sources, resulting in the copied currents not being accurate. The current generated in such a current source is therefore dependent on the temperature variations. It is difficult to obtain a current reference source giving a constant current that is not sensitive to variations in temperature. To illustrate this phenomenon, referring now to FIG. 1, we shall look at the drawing of a standard prior art current source using complementary metal oxide semiconductor (CMOS) technology.

The prior art current source includes three arms: b1, b2 and b3. The middle arm b2 is a current reference arm whose role is to fix a reference current. The third arm b3 is an output arm in which the reference current Iref is copied. The role of the first arm b1 is to fix a reference voltage V1.

The current reference arm b2 comprises a first MOS transistor M2 whose source electrode is connected to a voltage supply terminal VDD, and whose gate electrode and drain electrode are connected to each other. The MOS transistor M2 therefore makes it possible to fix a reference current in the first and third arms b1 and b3.

The drain electrode of the first MOS transistor M2 is connected to the source electrode of a second MOS transistor M5, whose drain electrode is connected at a node N to the potential V2 grounded by a first resistor R1. The first resistor R1 is series-connected with a set of n parallel-connected elements Q2 enabling a voltage V3 to be fixed, with n being an integer at least equal to two. According to a preferred embodiment of the invention, each parallel-connected element Q2 is formed by a diode. More precisely, it is a MOS transistor whose parasitic bipolar effects are used to form the diode.

The output arm b3 of the current source includes a MOS transistor M3 whose source is connected to the power supply terminal VDD, and whose gate is connected to the gate of the MOS transistor M2 of the current reference arm b2. Thus, by copying the reference current fixed by the current reference arm (b2) into the current mirror M2, M3, the output current Iref of the current source is provided at the drain of the transistor M3.

The arm b1 of the current source comprises a first MOS transistor M1 whose source electrode is connected to the supply terminal VDD. The gate electrode of the transistor M1 is connected to the gate electrode of the transistor M2 of the current reference arm b2 of the current source, thus forming a second current mirror. The current generated in the current reference arm b2 is copied in the arm b1, and the currents flowing in the arm b1 and in the arm b2 are thus equal. The drain electrode of the MOS transistor M1 is connected to the source electrode of a second MOS transistor M4, whose gate electrode is connected to the gate electrode of the MOS transistor M5 of the current reference arm b2. Furthermore, the gate electrode of the transistor M4 is connected to its source electrode.

Finally, the drain electrode of the transistor M4 is grounded by an element Q1 that is used to fix the voltage V1, and is identical to each of the n parallel-connected elements Q2 of the arm b2. Thus, according to a preferred embodiment, Q1 is a MOS transistor whose stray bipolar effects are used to form a diode.

The MOS transistors M4 and M5 make it possible for the first and second arms to be symmetrical, respectively b1 and b2, and form a voltage copying circuit which permits the copying of the reference voltage V1 fixed by the diode Q1 at the node N at the potential V2 of the arm b2, so that V2=V1.

The configuration of the MOS transistors M1, M2, M4 and M5 as described above therefore makes it possible to obtain equal currents I1 and I2 respectively flowing in the arms b1 and b2 of the current source, as well as equal voltages V1 and V2, according to a well-known principle of operation that needs no detailed description herein.

Consequently, the difference in potential ΔV at the terminals of the resistor R1 may be expressed as follows:

$$\begin{aligned} \Delta V &= V2 - V3 \\ &= V1 - V3 \end{aligned}$$

According to a standard equation governing operation of the bipolar transistors, we have:

$$V1 = VT*\ln(I1/Is1), \text{ and}$$

$$V3 = VT*\ln(I2/n*Is2)$$

Is1 and Is2 are the saturation currents of the diode-mounted transistors Q1 and Q2, and VT is the thermal voltage which physically corresponds to the ratio between the coefficient of diffusion of the charges and the mobility of the charges, and can be expressed as follows:

$$VT = \frac{k*T}{q}$$

The variable k is Boltzman's constant, T is the temperature (in degrees Kelvin) and q is the elementary charge.

Numerically, $k=1{,}381*10^{-23}$ $J*K^{-1}$ (Joules per Kelvin) and $q=1{,}602*10^{-19}$ C (coulombs). Consequently:

$$\Delta V = \frac{k*T*\ln}{q}\left[\frac{I1}{Is1}*\frac{n*Is2}{I2}\right]$$

The diode-mounted transistors Q1 and Q2 are advantageously designed to be identical so as to present the same physical properties, hence Is1=Is2. Furthermore, we have already seen above that, by current copying, the currents I1 and I2 are identical. The potential difference ΔV at the terminals of the resistor R1 can then be expressed as follows:

$$\Delta V = \frac{k*T}{q}*\ln(n)$$

The current I2, generated by the potential difference ΔV at the terminals of the resistor R1 and flowing through the arm b2, is expressed conventionally by the following relationship:

$$I2 = \frac{\Delta V}{R1}$$

Now, by copying the current in the MOS transistor M3, the currents Iref and I2 are identical. Consequently:

$$Iref = \frac{k*T}{q}*\ln(n)/R1 \quad (1)$$

Here we can understand the value of placing n transistors Q2 in parallel since, without this characteristic and through simplifying the equations, the output current Iref of the current reference source would be theoretically zero.

The above relationship (1) clearly shows that the current Iref varies linearly with the temperature T (in the ideal case where the value of the resistor R1 does not vary with the temperature), and the variation of the current Iref as a function of the temperature is expressed according to the following expression:

$$\frac{\delta Iref}{\delta T} = \frac{k}{q}*\ln(n)/R1$$

A prior art current source of this kind therefore raises a problem of stability of the reference current given in relation to the temperature. This aspect may prove to be an inherent defect in many applications.

SUMMARY OF THE INVENTION

An object of the present invention is to overcome the drawbacks of the prior art by improving the current sources of the type described in FIG. 1 so that the given reference current is independent of the temperature.

This and other objects, advantages and features according to the present invention are provided by implementation of a current reference circuit whose temperature-related stability depends directly on a ratio of resistances, enabling compensation for the temperature-related variations in the reference current based upon the respective resistance values.

The invention therefore relates to a temperature-compensated current source comprising a first arm fixing a reference voltage by using a diode, a second arm fixing a reference current, and a third arm providing a temperature-stable output current. The temperature-stable output current is obtained by copying, in a first current mirror, the current fixed by the second current reference arm.

A second current mirror is designed for copying, in the first voltage reference arm, the current fixed by the second current reference arm, while a voltage copying circuit copies the reference voltage fixed by the first arm at the level of a node of the second arm connected to ground by a first resistor.

The first resistor is series-connected with n parallel-connected diodes. The current source is characterized in that the second current reference arm furthermore comprises a second resistor parallel-connected with the assembly formed by the first resistor series-connected with the n parallel-connected diodes so that the variations of the reference current are compensated based upon the respective values of the first and second resistors.

BRIEF DESCRIPTION OF THE DRAWINGS

Other features and advantages of the present invention shall appear more clearly from the following description, given by way of an illustration that in no way restricts the scope of the invention and made with reference to the appended drawings, of which.

DETAILED DESCRIPTION OF THE PREFERRED EMBODIMENTS

Figure 1:
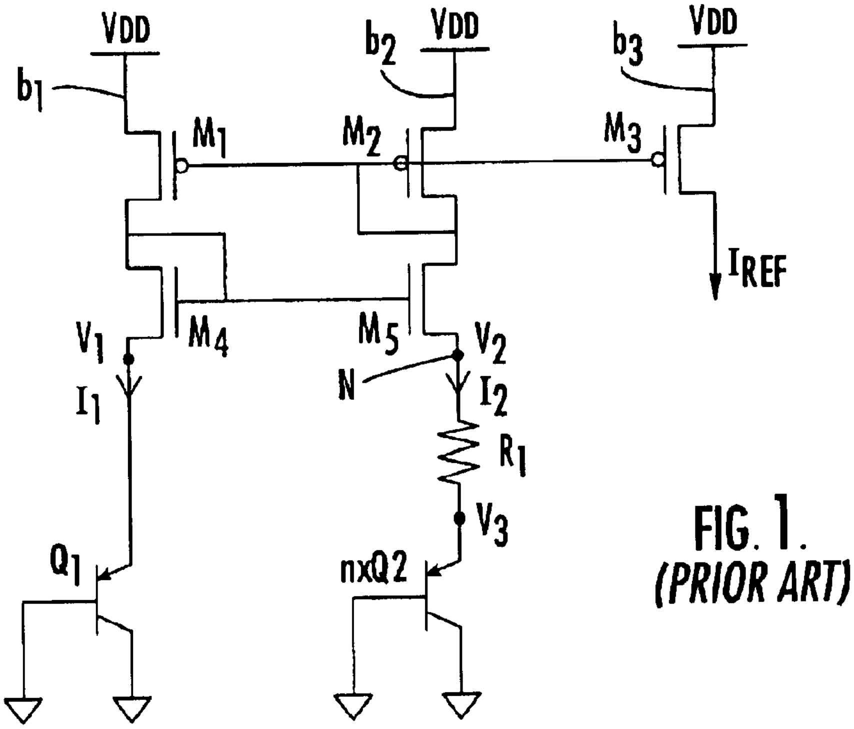
FIG. 1. (PRIOR ART)
FIG. 1 is a schematic drawing of a current source according to the prior art.
Figure 2:
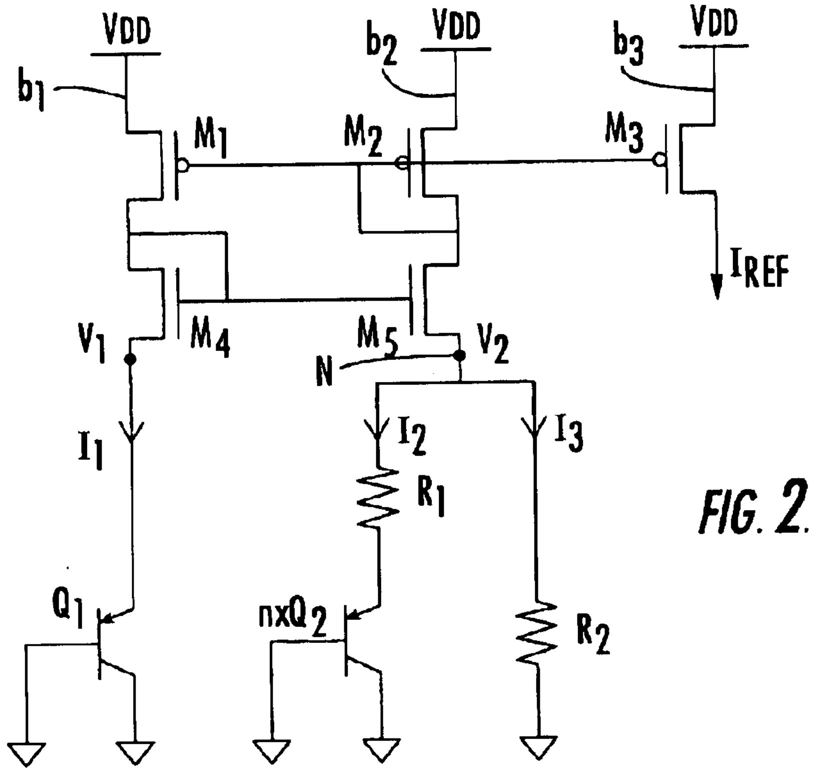
FIG. 2 is a schematic drawing of a temperature-compensated current source according to the present invention.

FIG. 2 illustrates the temperature-compensated current source according to the present invention. The description of the structural and functional characteristics already made above with reference to FIG. 1 illustrating a prior art current source can be applied to the circuit of FIG. 2. A difference between the current source according to the invention and the prior art circuit of FIG. 1 is in the addition of a resistor R2 that is parallel-connected with the arm formed by the resistor R1, which is series-connected with n parallel-connected diodes. The additional arm formed by the resistor R2 is connected between ground and the node N at the potential V2, and conducts a current I3.

A physical approach may be implemented in a first stage. This reasoning is based on the currents flowing in the different arms of the circuit, and their variations as a function of the temperature. According to a known characteristic of bipolar transistors, an increase in the temperature T prompts a reduction of the voltage at the terminals of a bipolar transistor, and more specifically, of the base-emitter voltage. This reduction of the voltage at the terminals of a bipolar transistor with respect to the temperature is about −2 mV/° C. (millivolts per degree Celsius).

Thus, an increase in the temperature T causes a reduction of the potential V1. The potential V1 is fixed by the diode Q1, which is formed by using the parasitic bipolar effects of a MOS transistor, which are used as a diode. Since the potential V1 serves as a reference for the potential V2, the latter also falls when the temperature T rises. Thus, the difference in potential at the terminals of the resistor R2 diminishes. This leads to a reduction in the current 13 flowing through the arm formed by the resistor R2 by the application of Ohm's law.

In the other parallel-connected arm formed by the resistor R1 series-connected with the n parallel-connected diodes Q2, an increase in the temperature T leads to an increase in the value of the current I2 traveling through this arm. The current I2 is linked to the temperature T by the relationship (1) provided above with reference to FIG. 1. According to this relationship, I2=[(k*T)/q]*ln(n)/R1.

Setting aside the variations in the value of the resistance with the temperature, which are not taken into account here, the current I2 therefore varies linearly with the temperature, and in the same sense as the temperature. In view of the respective variations in the currents I2 and I3 as a function of the temperature, it can be seen that, by properly sizing the resistors R1 and R2, it is possible to obtain a constant-temperature total current I2+I3 through the transistors M2 and M5, and therefore, by copying through the MOS transistor M3, a constant-temperature reference current Iref.

The result (1) has made it possible to establish the following relationship:

$$I_2 = \frac{k*T}{q}*\ln(n)/R1.$$

It can be determined therefrom that the current variation I2 as a function of the temperature T is set up as follows:

$$\frac{\delta I2}{\delta T} = \frac{k}{q}*\ln(n)/R1.$$

It is recalled here that, with reference to FIG. 2 illustrating the preferred embodiment of the invention, the variations in the resistance values as a function of the temperature T are not taken into account. Also, in considering the arm formed by the resistor R2, the current I3 may be expressed as follows:

$$I3 = \frac{V2}{R2} = \frac{VBE1}{R2}$$

VBE1 corresponds to the base-emitter voltage of the parasitic bipolar of the MOS transistor used to form the diode Q1.

Given that, as seen above, for a bipolar transistor we have δVBE/δT=−2 mV/° C., the variation of the current I3 as a function of the temperature may be expressed as:

$$\frac{\delta I3}{\delta T} = -2*10^{-3}/R2.$$

Since the reference current Iref is equal to the sum of the currents I2 and I3 by copying through the MOS transistor M3, the relationship expressing the variation of the reference current as a function of the temperature can then be established as follows:

$$\frac{\delta Iref}{\delta T} = \frac{k}{q}*\ln(n)/R1 - 2*10^{-3}/R2. \quad (2)$$

The ratio δIref/δT must then be made zero to ensure the consistency of the reference current Iref with respect to the temperature. To do this, it is necessary to properly size the respective resistors R1 and R2 so as to obtain an adequately sized ratio between the two respective resistors R1 and R2, thus enabling the cancellation of the above expression (2). For example, for n=8, namely eight diode-mounted transistors Q2 in parallel, the ratio obtained is R2=11*R1. This ratio between the two resistors R1 and R2 must necessarily be applied in the implementation of the current source to obtain the constancy in temperature of the reference current Iref.

The invention therefore proposes a straightforward, low-cost approach to optimize the prior art current reference circuit as described in reference to FIG. 1, and thus make it possible, by the addition of only one element, to obtain a temperature-stable circuit. By setting the respective values of the resistors R1 and R2, the temperature-related current variations may be compensated for so that they can provide a temperature-stable reference current. The current source according to the present invention is first, independent of the temperature, and second, very stable with respect to the variations in the manufacturing method since its stability depends on a ratio of resistances.

Figure 3:
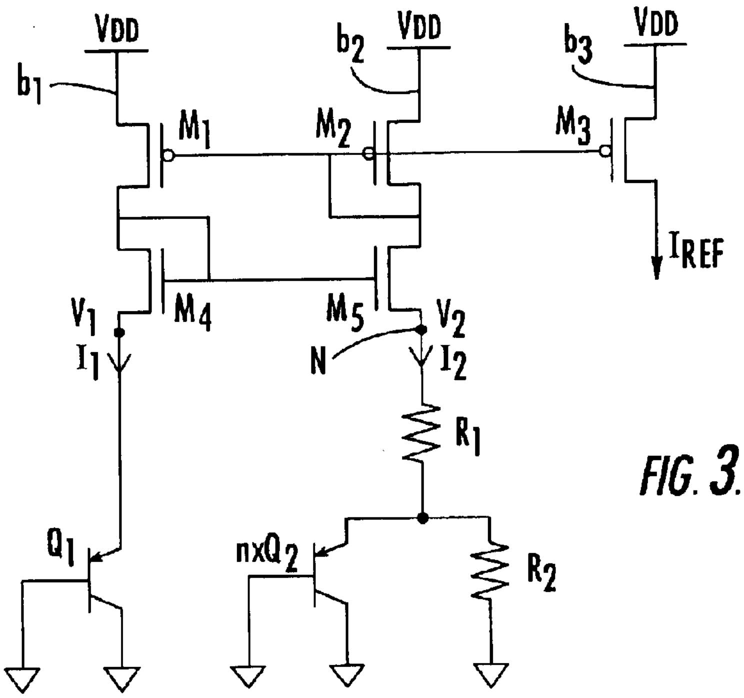
FIG. 3 is a schematic drawing illustrating a particular embodiment of the temperature-compensated current source in FIG. 2.

FIG. 3 shows a particular embodiment of the invention that is designed particularly for adaptation to the non-ideal case where the variations in the resistance values as a function of temperature are taken into account. This type has the direct consequence of introducing second-order terms into the equation (2). The approach described above with reference to FIG. 2 does not permit compensating for these second-order terms. The stability of the current source is therefore lowered when these second-order terms are considered.

To overcome this problem, the particular embodiment of the invention referred to in FIG. 3 includes the addition of the second resistor R2 to the current reference arm b2 directly in parallel with the set of n diode-mounted transistors Q2 in parallel. This particular configuration advantageously gives a substantial reduction in the second-order temperature drift of the reference current given by the source according to the invention, as above, based upon the ratio of the resistors R1 and R2. Since the theoretical modeling of this approach is done by a non-linear system of equations, it is not presented here, given the complexity of the computations to be performed.

Figure 4:
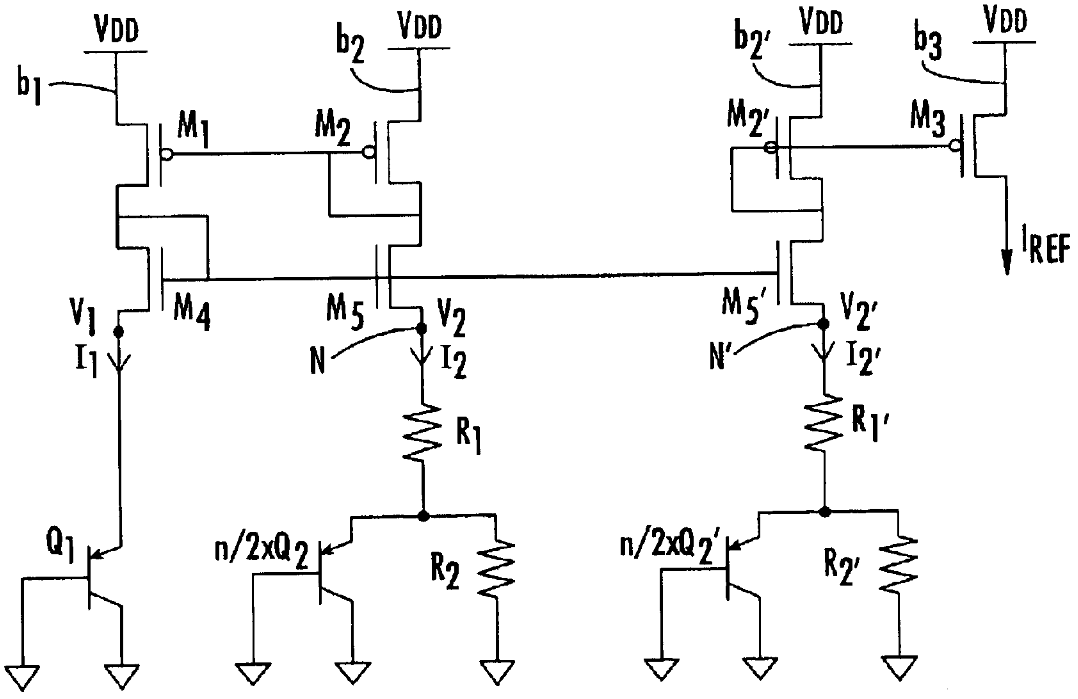
FIG. 4 is a schematic drawing illustrating another particular embodiment of the temperature-compensated current source in FIG. 2.

However, again considering a system that takes account of the variations in the resistance values as a function of the temperature, a higher stability of the current may further be obtained with respect to the second-order drift in temperature through the configuration of FIG. 4. FIG. 4 illustrates another particular embodiment of the invention.

In this embodiment, the current reference arm b2 described with reference to FIG. 3 is cascaded. In other words, an additional arm b2' is interposed between the arm b2 and the output arm b3 of the current source according to the invention. The additional arm b2' has exactly the same structure as the current reference arm b2, and therefore comprises the same elements connected in the same way.

Thus, the arm b2' has a first MOS transistor M2' whose source electrode is connected to the supply VDD, and whose gate electrode and drain electrode are connected to each other. The gate electrode of M2' is also connected to the gate electrode of the MOS transistor M3 so as to copy the current I2' generated in the arm b2' at the drain electrode of the transistor M3 with Iref=I2'.

The drain electrode of the transistor M2' is connected to the source electrode of a second MOS transistor M5', whose gate electrode is connected to the gate electrode of the transistor MS of the arm b2. Finally, the drain electrode of the second transistor M5' of the additional arm is connected to a node N' grounded by a first resistor R1' series-connected with a set of n/2 diode-mounted MOS transistors Q2' in parallel, to which a second resistor R2' is directly connected in parallel.

In this configuration, the resistor R2' is therefore positioned directly in parallel with the set of n/2 diodes Q2' just as, in the arm b2, the resistor R2 is positioned directly in parallel with a set of n/2 diodes Q2. Since efficient compensation is achieved for different ratios R2/R1 and R2/R1', the principle of this approach compensates for the two arms in opposite ways so as to stabilize the current in terms of the temperature. The resistor R2' can then be optional.

That which is claimed is:

1. A temperature-compensated current source comprising:

a first arm connected between first and second voltage references for setting a reference voltage;

a second arm connected between the first and second voltage references for setting a reference current, and comprising a first resistor connected to a node on said second arm, a plurality of parallel-connected diodes connected in series with said first resistor and connected to the second voltage reference, and a second resistor connected between the node on said second arm and the second voltage reference so that said second resistor is parallel to said first resistor and said plurality of parallel-connected diodes, said first and second resistors having respective values for compensating temperature variations of the reference current; and a third arm connected to the first voltage reference for providing a temperature-stable output current;

said second and third arms forming a first current mirror, said first and second arms forming a second current mirror, and said first and second arms further forming a voltage copying circuit so that the temperature-stable output current is based upon said first and second current mirrors respectively copying the reference current in said second arm, and based upon said voltage copying circuit copying the reference voltage set by said first arm at the node on said second arm.

2. A temperature-compensated current source according to claim 1, wherein said first arm comprises a first transistor connected to the first voltage reference, and a second transistor connected to said first transistor and to a second voltage reference; wherein said second arm further comprises a third transistor connected to the first voltage reference, and a fourth transistor connected between said third transistor and the node on said second arm; and wherein said third arm comprises a fifth transistor connected to the first voltage reference;

said third and fifth transistors forming the first current mirror, said first and third transistors forming the second current mirror, and said second and fourth transistors forming the voltage copying circuit.

3. A temperature-compensated current source according to claim 2, wherein said second and third transistors are configured as diodes.

4. A temperature-compensated current source according to claim 1, wherein the second voltage reference is ground.

5. A temperature-compensated current source according to claim 2, wherein said first, second, third, fourth and fifth transistors comprise MOS transistors.

6. A temperature-compensated current source according to claim 5, wherein said first, third and fifth transistors comprise MOS transistors having a first type of conductivity; and wherein said second and fourth transistors comprise MOS transistors having a second type of conductivity.

7. A temperature-compensated current source according to claim 1, wherein said plurality of parallel-connected diodes comprise MOS transistors configured as diodes having parasitic bipolar effects being used as diodes.

8. A temperature-compensated current source comprising:

a first arm connected between first and second voltage references for setting a reference voltage;

a second arm connected between the first and second voltage references for setting a reference current, and comprising a first resistor connected to a node on said second arm, a plurality of parallel-connected diodes connected in series with said first resistor and connected to the second voltage reference, and a second resistor connected to the second voltage reference and connected in parallel to said plurality of parallel-connected diodes, said first and second resistors having respective values for compensating temperature variations of the reference current; and a third arm connected to the first voltage reference for providing a temperature-stable output current;

said second and third arms forming a first current mirror, said first and second arms forming a second current mirror, and said first and second arms further forming a voltage copying circuit so that the temperature-stable output current is based upon said first and second current mirrors respectively copying the reference current in said second arm, and based upon said voltage copying circuit copying the reference voltage set by said first arm at the node on said second arm.

9. A temperature-compensated current source according to claim 8, wherein said first arm comprises a first transistor connected to the first voltage reference, and a second transistor connected to said first transistor and to a second voltage reference; wherein said second arm further comprises a third transistor connected to the first voltage reference, and a fourth transistor connected between said third transistor and the node on said second arm; and wherein said third arm comprises a fifth transistor connected to the first voltage reference;

said third and fifth transistors forming the first current mirror, said first and third transistors forming the second current mirror, and said second and fourth transistors forming the voltage copying circuit.

10. A temperature-compensated current source according to claim 9, wherein said second and third transistors are configured as diodes.

11. A temperature-compensated current source according to claim 8, wherein the second voltage reference is ground.

12. A temperature-compensated current source according to claim 9, wherein said first, second, third, fourth and fifth transistors comprise MOS transistors.

13. A temperature-compensated current source according to claim 12, wherein said first, third and, fifth transistors comprise MOS transistors having a first type of conductivity; and wherein said second and fourth transistors comprise MOS transistors having a second type of conductivity.

14. A temperature-compensated current source according to claim 8, wherein said plurality of parallel-connected diodes comprise MOS transistors configured as diodes having parasitic bipolar effects being used as diodes.

15. A temperature-compensated current source comprising:

a first arm connected between first and second voltage references for setting a reference voltage;

a second arm connected between the first and second voltage references for setting a reference current, and comprising a first resistor connected to a node on said second arm, a plurality of parallel-connected diodes connected in series with said first resistor and connected to the second voltage reference, and a second resistor connected to the second voltage reference and connected in parallel to said plurality of parallel-connected diodes, said first and second resistors having respective values for compensating temperature variations of the reference current;

a third arm connected between the first and second voltage references for setting a reference current and comprising a first resistor connected to a node on said third arm, a plurality of parallel-connected diodes connected in series with said first resistor and connected to the second voltage reference, and a second resistor connected to the second voltage reference and connected in parallel to said plurality of parallel-connected diodes, said first and second resistors having respective values for compensating temperature variations of the reference current; and a fourth arm connected to the first voltage reference for providing a temperature-stable output current;

said third and fourth arms forming a first current mirror, said first and second arms forming a second current mirror, and said first and second arms further forming a voltage copying circuit so that the temperature-stable output current is based upon said first and second current mirrors respectively copying the reference current in said second arm, and based upon said voltage copying circuit copying the reference voltage set by said first arm at the node on said second arm.

16. A temperature compensated current source according to claim 15, wherein said third arm further comprises a fourth resistor connected to the second voltage reference and connected in parallel with said plurality of parallel-connected diodes.

17. A temperature-compensated current source according to claim 15, wherein said first arm comprises a first transistor connected to the first voltage reference, and a second transistor connected to said first transistor and to a second voltage reference; wherein said second arm comprises a third transistor connected to the first voltage reference, and a fourth transistor connected to the third transistor; and wherein said third arm comprises a fifth transistor connected to the first voltage reference;

said third and fifth transistors forming the first current mirror, said first and third transistors forming the second current mirror, and said second and fourth transistors forming the voltage copying circuit.

18. A temperature-compensated current source according to claim 17, wherein said second and third transistors are configured as diodes.

19. A temperature-compensated current source according to claim 15, wherein the second voltage reference is ground.

20. A temperature-compensated current source according to claim 16, wherein said first, second, third, fourth and fifth transistors comprise MOS transistors.

21. A temperature-compensated current source according to claim 20, wherein said first, third and fifth transistors comprise MOS transistors having a first type of conductivity; and wherein said second and fourth transistors comprise MOS transistors having a second type of conductivity.

22. A temperature-compensated current source according to claim 15, wherein said plurality of parallel-connected diodes comprise MOS transistors configured as diodes having parasitic bipolar effects being used as diodes.

23. A method for providing a temperature-stable output current using a temperature-compensated current source, the method comprising:

setting a reference voltage in a first arm of the temperature-compensated current source connected between first and second voltage references;

setting a reference current in a second arm of the temperature-compensated current source connected between the first and second voltage references, the second arm comprising a first resistor connected to a node on the second arm, a plurality of parallel-connected diodes connected in series with the first resistor and connected to the second voltage reference, and a second resistor connected between the node on the second arm and the second voltage reference so that the second resistor is parallel to the first resistor and the plurality of parallel-connected diodes, the first and second resistors having respective values for compensating temperature variations of the reference current; and providing the temperature-stable output current in a third arm connected to the first voltage reference;

the second and third arms forming a first current mirror, the first and second arms forming a second current mirror, and the first and second arms further forming a voltage copying circuit so that the temperature-stable output current is based upon the first and second current mirrors respectively copying the reference current in the second arm, and based upon the voltage copying circuit copying the reference voltage set by the first arm at the node on the second arm.

24. A method according to claim 23, wherein the first arm comprises a first transistor connected to the first voltage reference, and a second transistor connected to the first transistor and to a second voltage reference; wherein the second arm further comprises a third transistor connected to the first voltage reference, and a fourth transistor connected between the third transistor and the node on the second arm; and wherein the third arm comprises a fifth transistor connected to the first voltage reference;

the third and fifth transistors forming the first current mirror, the first and third transistors forming the second current mirror, and the second and fourth transistors forming the voltage copying circuit.

25. A method according to claim 24, wherein the second and third transistors are configured as diodes.

26. A method according to claim 23, wherein the second voltage reference is ground.

27. A method according to claim 24, wherein the first, second, third, fourth and fifth transistors comprise MOS transistors.

28. A method according to claim 27, wherein the first, third and fifth transistors comprise MOS transistors having a first type of conductivity; and wherein the second and fourth transistors comprise MOS transistors having a second type of conductivity.

29. A method for providing a temperature-stable output current using a temperature-compensated current source, the method comprising:

setting a reference voltage in a first arm of the temperature-compensated current source connected between first and second voltage references; setting a reference current in a second arm of the temperature-compensated current source connected between the first and second voltage references, the second arm comprising a first resistor connected to a node on the second arm, a plurality of parallel-connected diodes connected in series with the first resistor and connected to the second voltage reference, and a second resistor connected to the second voltage reference and connected in parallel to the plurality of parallel-connected diodes, the first and second resistors having respective values for compensating temperature variations of the reference current; and providing the temperature-stable output current in a third arm connected to the first voltage reference;

the second and third arms forming a first current mirror, the first and second arms forming a second current mirror, and the first and second arms further forming a voltage copying circuit so that the temperature-stable output current is based upon the first and second current mirrors respectively copying the reference current in the second arm, and based upon the voltage copying circuit copying the reference voltage set by the first arm at the node on the second arm.

30. A method according to claim 29, wherein the first arm comprises a first transistor connected to the first voltage reference, and a second transistor connected to the first transistor and to a second voltage reference; wherein the second arm comprises a third transistor connected to the first voltage reference, and a fourth transistor connected to the third transistor; and wherein the third arm comprises a fifth transistor connected to the first voltage reference;

the third and fifth transistors forming the first current mirror, the first and third transistors forming the second current mirror, and the second and fourth transistors forming the voltage copying circuit.

31. A method according to claim 30, wherein the second and third transistors are configured as diodes.

32. A method according to claim 29, wherein the second voltage reference is ground.

33. A method according to claim 30, wherein the first, second, third, fourth and fifth transistors comprise MOS transistors.

34. A method according to claim 33, wherein the first, third and fifth transistors comprise MOS transistors having a first type of conductivity; and wherein the second and fourth transistors comprise MOS transistors having a second type of conductivity.

* * * * *

UNITED STATES PATENT AND TRADEMARK OFFICE
CERTIFICATE OF CORRECTION

PATENT NO. : 6,759,893 B2
DATED : July 6, 2004
INVENTOR(S) : Gailhard et al.

It is certified that error appears in the above-identified patent and that said Letters Patent is hereby corrected as shown below:

Title page,
Item [73], Assignee, delete "FI" insert -- FR --

Column 4,
Line 61, delete "13" insert -- I3 --

Column 6,
Line 58, delete "MS" insert -- M5 --

Column 8,
Line 47, delete "and, fifth" insert -- and fifth --

Column 9,
Line 27, delete "temperature compensated" insert -- temperature-compensated --

Column 10,
Lines 55-61, delete "setting a reference voltage in a first arm of the temperature-compensated current source connected between first and second voltage references; setting a reference current in a second arm of the temperature-compensated current source connected between the first and second voltage references, the second arm comprising" insert -- setting a reference voltage in a fist arm of the temperature-compensated current source connected between first and second voltage references;

setting a reference current in a second arm of the temperature-compensated current source connected between the first and second voltage references, the second arm compresing --

Signed and Sealed this

First Day of February, 2005

JON W. DUDAS
*Director of the United States Patent and Trademark Office*